(12) United States Patent
Yang et al.

(10) Patent No.: US 6,514,861 B1
(45) Date of Patent: Feb. 4, 2003

(54) MANUFACTURING A SEMICONDUCTOR WAFER ACCORDING TO THE PROCESS TIME BY PROCESS TOOL

(75) Inventors: Ming-Cheng Yang, Taipei (TW); Jun-Yi Lee, Yunlin (TW); Yun-Yu Chan, Taipei (TW); Sheng-Tsaing Tseng, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/175,006

(22) Filed: Jun. 20, 2002

(51) Int. Cl.[7] ............................................. H01L 21/302
(52) U.S. Cl. ...................... 438/690; 438/692; 438/693; 438/959; 438/633
(58) Field of Search .......................... 438/763, 690–693, 438/631–633, 759, 959, 977

(56) References Cited

U.S. PATENT DOCUMENTS

| | | | | |
|---|---|---|---|---|
| 5,637,031 A | * | 6/1997 | Chen ........................... | 451/285 |
| 5,705,435 A | * | 1/1998 | Chen ........................ | 156/345.13 |
| 6,221,773 B1 | * | 4/2001 | Yasui et al. .................. | 438/690 |
| 6,271,140 B1 | * | 8/2001 | Chang ......................... | 438/692 |

* cited by examiner

Primary Examiner—Tuan H. Nguyen
Assistant Examiner—Thanh Nguyen
(74) Attorney, Agent, or Firm—Birch, Stewart, Kolasch & Birch, LLP

(57) ABSTRACT

A semiconductor process for manufacturing a wafer. First, a previously predicted process rate and a previously measured process rate are provided by a process tool. Next, a presently predicted process rate is obtained by a first linear equation having a first variable weighting factor using the previously predicted process rate and the previously measured process rate as variables. Next, a process time is obtained according to the presently predicted process rate and a predetermined process target to input to the process tool. Finally, the wafer is manufactured according to the process time by the process tool.

20 Claims, 4 Drawing Sheets

MANUFACTURING A SEMICONDUCTOR WAFER ACCORDING TO THE PROCESS TIME BY PROCESS TOOL

BACKGROUND OF THE INVENTION

1. Field of the Invention

The present invention relates to semiconductor technology, and more particularly to a method to predict the removal rate of chemical mechanical polishing to precisely control the polishing time for wafers.

2. Description of the Related Art

As semiconductor devices are scaled down, the importance of chemical mechanical polishing (CMP) to the fabrication process increases. Generally, a chemical mechanical polishing tool includes a polishing device, a cleaning device, and a measurement device. The polishing device is positioned above a rotatable circular platen or table on which a polishing pad is mounted. However, as the removal rate of CMP decreases with consumption of the polishing pad, it is difficult to control polishing time for polishing wafers. In order to control the polishing time for wafers, it is necessary to estimate the removal rate of the wafer. That is, the precise polishing time can be input to the CMP tool by properly predicting the removal rate of the wafers. As a result, the desired polishing thickness of layers to be polished on the wafers can be obtained.

FIG. 1 is a flow chart for controlling chemical mechanical polishing according to the prior art. First, in step S1, a measurement device measures the pre-polishing thickness of the control wafer. Next, in step S2, the control wafer is placed in the CMP tool to polish with polishing time input. Next, in step S3, the measurement device then measures the post-polishing thickness of the control wafer. Next, in step S4, a removal rate is obtained by the predetermined polishing time and the control wafer's thickness difference between pre-polishing and post-polishing. Next, in step S5, the measurment device measures the thickness of a layer to be polished on the product wafer. Next, in step S6, a new polishing time is determined by the removal rate of the control wafer and the desired polishing thickness of the layer to be polished on the product wafer. Next, in step S7, the product wafer is polished according to the polishing time. Next, in step S8, the thickness of the product wafer is measured. Next, step S9 determines whether the next product wafer is to be polished. If not, the CMP is finished, as indicated at step S10. If the next product wafer is to be polished, steps S5 to S8 are repeated. The determining of the polishing time, as indicated in step S6, accords to the removal rate of the previous wafer or lot thereof and the desired polishing thickness of the present wafer or lot of the product wafers. In general, a simple linear combination between the previously measured removal rate of the control wafer and the previously predicted removal rate is used to predict a present removal rate. Thereafter, a polishing time for the product wafer can be obtained according to the present removal rate.

However, since the variation resulting from the process incoming noise and the removal rate decay due to the consumption of the polishing pad, the polishing time obtained by the mentioned method is not precise. As a result, underpolishing occurs in the product wafers. Accordingly, some methods, such as exponentially weighted moving average (EWMA) and predictor-corrector controller (PCC), have been suggested for precisely predicting the removal rate to obtain the polishing time. Since these methods use a constant weighting factor, CMP consumable problems cannot be overcome. That is, the polishing time cannot be precisely controlled.

SUMMARY OF THE INVENTION

It is therefore an object of the present invention to provide a semiconductor process for manufacturing at least one wafer to effectively control the process time by variable weighting factors.

According to an aspect of the invention, there is provided a semiconductor process for manufacturing at least one wafer. First, a previously predicted process rate and a previously measured process rate are provided by a process tool. Next, a presently predicted process rate is obtained by a first linear equation having a first variable weighting factor using the previously predicted process rate and the previously measured process rate as variables. Next, a process time is obtained according to the presently predicted process rate and a predetermined process target to input to the process tool. Finally, the wafer is manufactured according to the process time by the process tool. The first linear equation and the first variable weighting factor are: $RR^*(t)=W1(t) \times RR(t-1)+(1-W1(t)) \times RR^*(t-1)$, and $W1(t)=W1+\gamma 1^t$, $0<\gamma 1<1$. Where W1 and $\gamma 1$ are experienced constants.

Moreover, in the semiconductor process, a previous adjustment value $D(t-1)$ is further provided. Thereafter, a present adjustment value $D(t)$ is obtained by a second linear equation using the previous adjustment value $D(t-1)$ and the difference of the presently predicted removal rate and the previously predicted removal rate as variables. The presently predicted removal rate is modified by the present adjustment value $D(t)$. The second linear equation has a second variable weighting factor, in which the second linear equation and the second variable weighting factor are: $D(t)=W2 \ (t) \times (RR^*(t-1)-RR^*(t))+(1-W2(t)) \times D(t-1)$, and $W2(t)=W2+\gamma 2^t$, $0<\gamma 2<1$. Where W2 and $\gamma 2$ are experienced constants.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
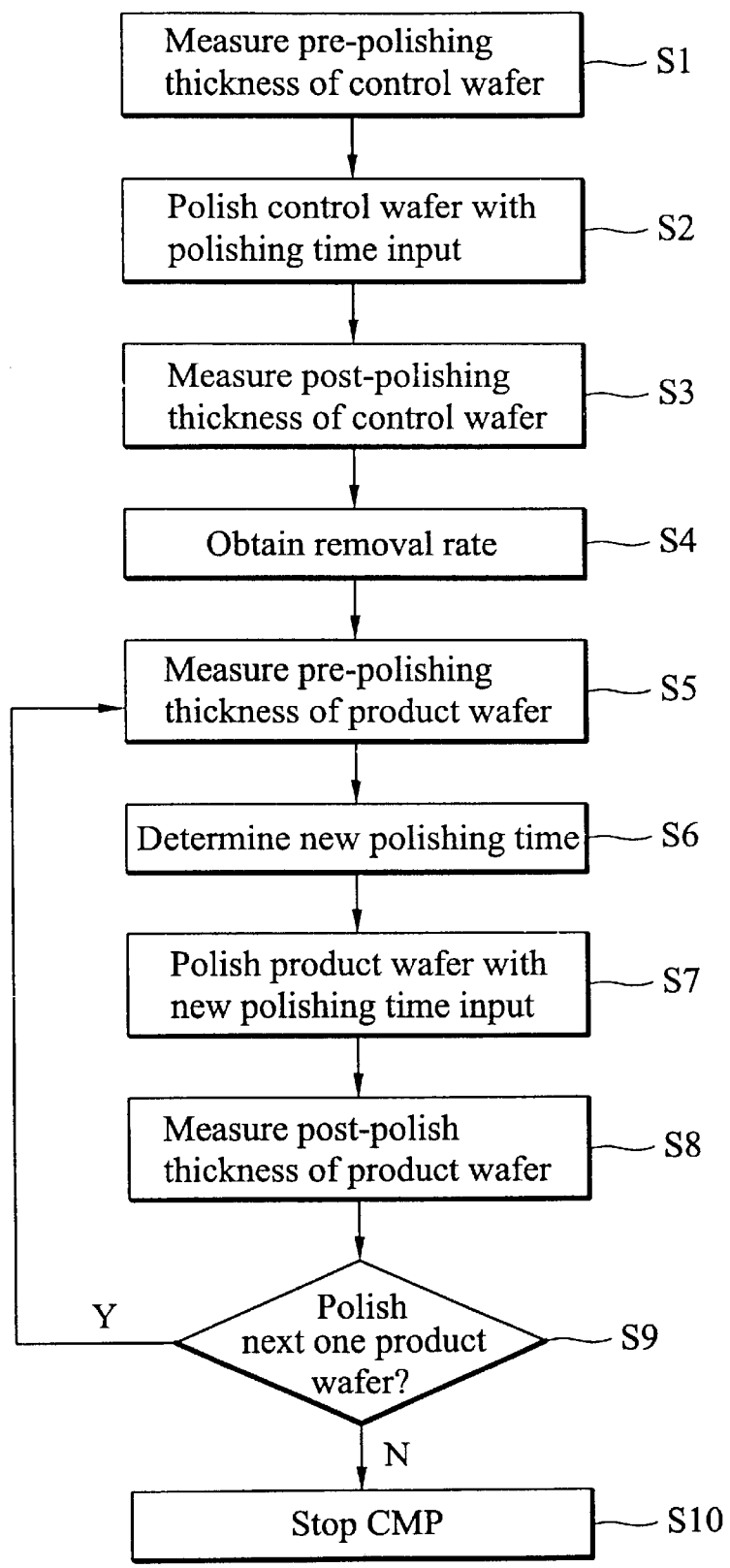
FIG. 1 is a flow chart for controlling chemical mechanical polishing according to the prior art.
Figure 2:
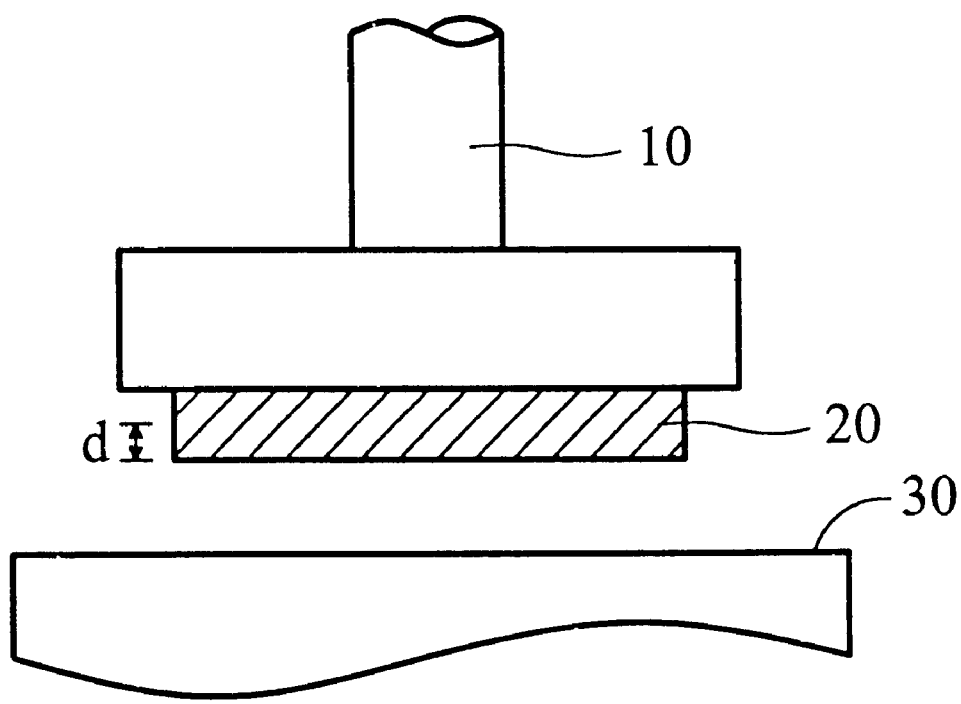
FIG. 2 is a sectional diagram showing an exemplary chemical mechanical polishing tool.

FIG. 2 is an exemplary chemical mechanical polishing tool. The chemical mechanical polishing tool 5 includes a wafer carrier 10 and a polishing pad 30. The carrier 10 is positioned above the polishing pad 30 to fix the wafer 20 and to transport it onto the polishing pad 30. The polishing thickness d of the wafer 20 is controlled by a controller (not shown) in the CMP tool 5 and determined by a polishing time obtained from predicting a removal rate.

Figure 3:
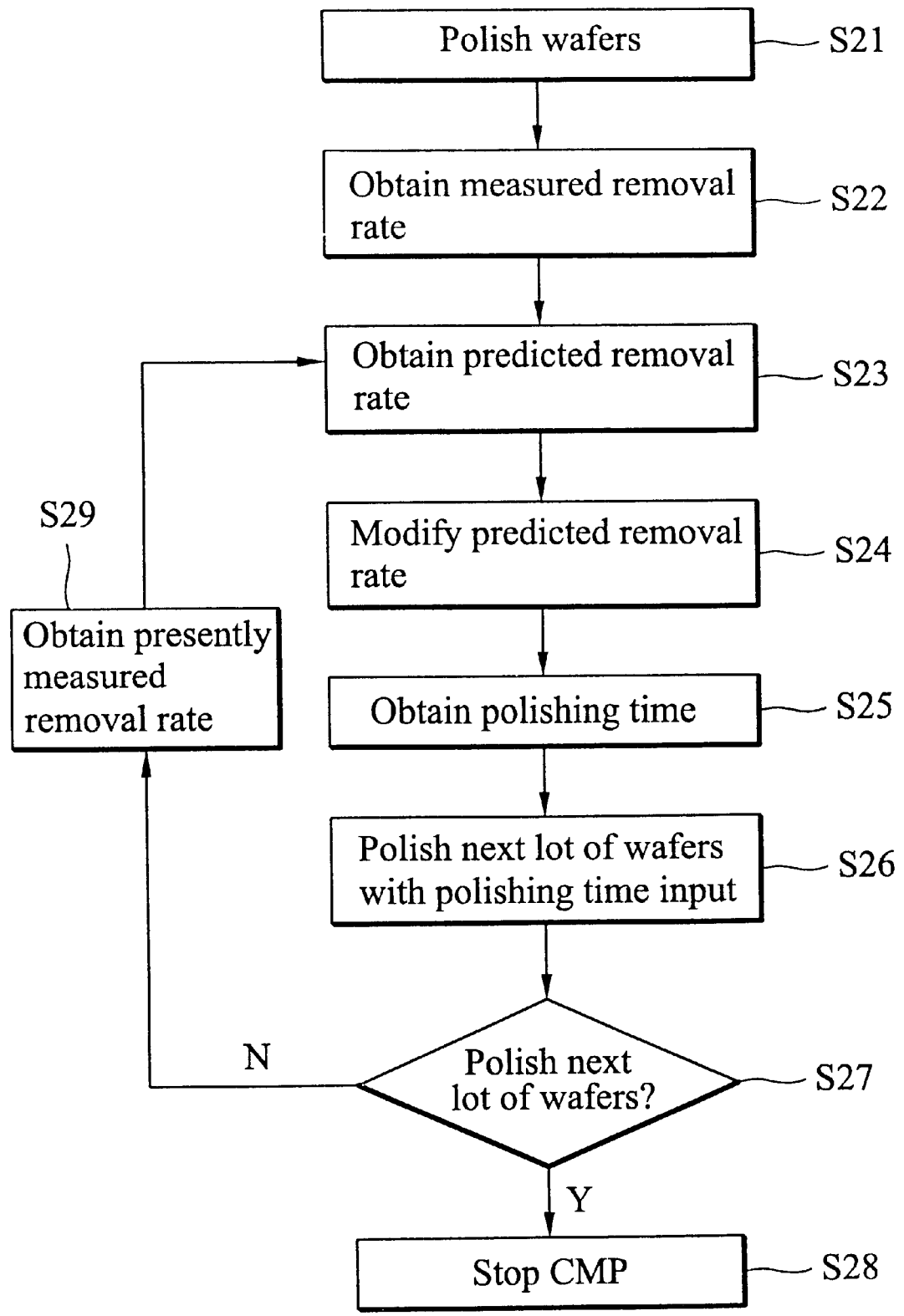
FIG. 3 is a flow chart for controlling chemical mechanical polishing according to the present invention.

FIG. 3 is a flow chart for controlling chemical mechanical polishing according to the present invention. First, a presently measured process rate such as a removal rate is necessary to provide by a process tool such as a CMP tool. For example, in step S21, wafers such as control wafers or product wafers are polished by CMP tool. Thereafter, in step S22, an initial measured removal rate RR(0) is obtained by the predetermined process time such as polishing time and thickness difference of the wafer between pre-polishing and post-polishing. That is, RR(0)=(Pre(0)−Post(0))/PT(0), where the Pre(0) represents the pre-polishing thickness, Post(0) represents the post-polishing thickness, and the PT(0) represents the predetermined polishing time.

Hence, two equations (RR(t) and RR*(t)) are defined, where t represents lot number of wafers. RR(t) represents a presently measured removal rate (RR(t)=(Pre(t)−Post(t))/PT(t)). It must be obtained by measuring the thickness of the wafers. RR*(t) represents a presently predicted removal rate. RR*(t) is obtained by previously measured removal rate RR(t−1) and previously predicted removal rate RR*(t−1), and used for obtaining the polishing time for the next lot of wafers. Hence, and RR*(0) is equal to RR(0).

Next, in step S23, the presently predicted removal rate RR*(t) is calculated by linear equation (1) using RR(t−1) and RR*(t−1) as variables, as described below. In addition, W1(t) is a variable weighting factor, which varies with the lot number (t), and represents equation (2) as described below.

$$RR^*(t)=W1(t)\times RR(t-1)+(1-W1(t))\times RR^*(t-1) \quad (1)$$

$$W1(t)=W1+\gamma 1^t, 0<\gamma 1<1. \quad (2)$$

W1 and γ1 are experienced constants. For example, W1 is equal to 0.3, and the γ1 is equal to 0.2.

As a result, the process variation due to the process incoming noise with increasing lot number (t) (increasing the consumption of the polishing pad) can be effectively eliminated.

Next, in the optional step S24, a present adjustment value D(t) is obtained by linear equation (3) using D(t−1) and RR*(t−1)−RR*(t) as variables to modify the presently predicted removal rate RR*(t), as described below. D(t−1) represents a adjustment value of the preceding lot of wafers. In addition, W2(t) is a variable weighting factor, which varies with the lot number (t), and represents equation (4) as described below.

$$D(t)=W2(t)\times(RR^*(t-1)-RR^*(t))+(1-W2(t))\times D(t-1) \quad (3)$$

$$W2(t)=W2+\gamma 2_t, 0<\gamma 2<1. \quad (4)$$

W2, and γ2 are experienced constants. For example, W2 is equal to 0.3, and the γ2 is equal to 0.2. In addition, the initial adjustment value D(0) is equal to 0 or other experienced constant.

The adjustment value D(t) is used to predict the drift value of the removal rate, and eliminating the drift value from predicted removal rate RR*(t). The predicted removal rate after modifying RR**(t) is the difference of the predicted removal rate RR*(t) and the adjustment value D(t)(RR**(t)=RR*(t)−D(t)).

Next, in step S25, a process target, such as polishing thickness of a layer to be polished on the wafer, is determined. Thereafter, polishing time PT(t) can be calculated according to the predetermined polishing thickness and the predicted removal rate RR*(t) or the predicted removal rate after modifying RR**(t)(PT(t)=polishing thickness/RR*(t) or PT(t)=polishing thickness/RR**(t)), and then input it to the CMP tool.

Next, in step S26, the next lot of wafers is polished according to the polishing time by the CMP tool. In addition, it can obtain pre-polishing thickness Pre(t) of a layer to be polished on the product wafer by a measurement device.

Next, in step S27, whether the next lot of product wafers is polished is determined. For example, estimating whether the polishing pad has processed excess wafers. If so, step S28 commences, and the CMP breaks off for preventive maintenance (PM). If not, proceeding to step S29, post-polishing thickness Post(t) is measured by the measurement device, and the measured removal rate RR(t) of the present lot of wafers can be obtained by the relation: RR(t)=(Pre(t)−Post(t))/PT(t). Thereafter, steps S23 to step S26 are repeated.

Figure 4:
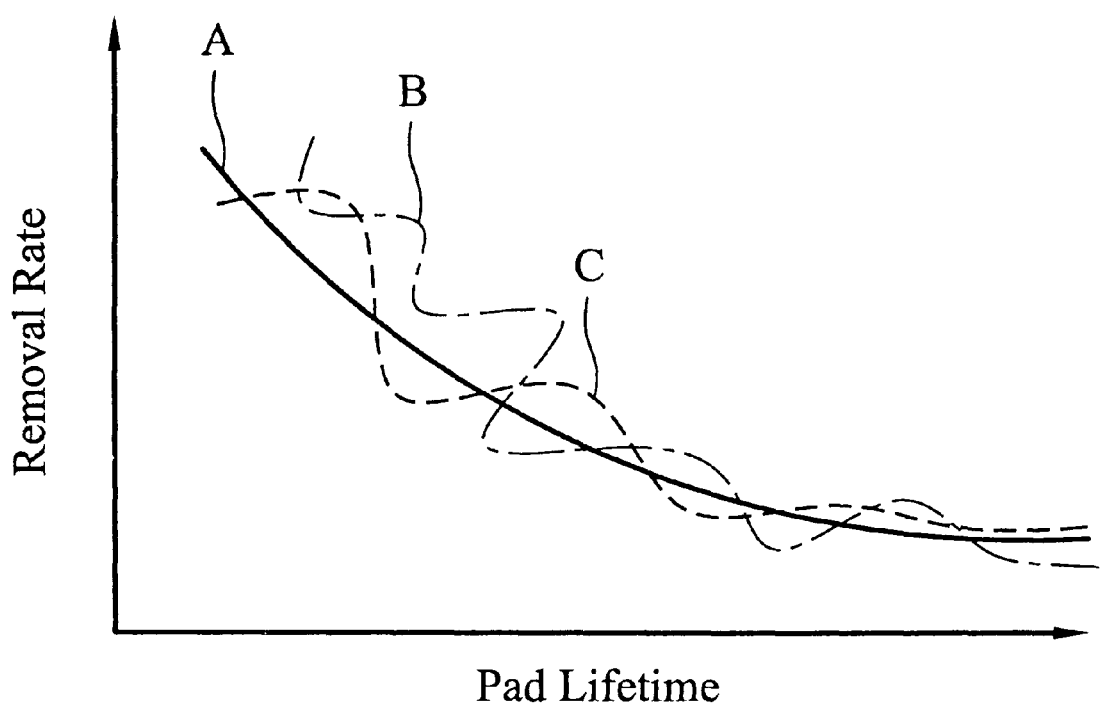
FIG. 4 is a graph showing the relation between the removal rate and the pad lifetime according to the prior art and the invention, respectively.

FIG. 4 is a graph showing the relation between removal rate and polishing pad lifetime according to the prior art and the invention, respectively. "A" represents a relational curve between removal rate and pad lifetime according to the present invention. "B" represents a relational curve between removal rate and pad lifetime according to the prior art (EWMA). "C" represents a relational curve between removal rate and pad lifetime according to more prior art (PCC). According to the present invention, since two variable weighting factors (W1(t) and W2(t)) are used for effectively eliminating the variation due to the process incoming noise and the drift value of the removal rate, a smooth curve A can be obtained. On the contrary, in the prior art (EWMA and PCC), since constant weighting factors are used, vibration and unstable curves (B and C) are obtained. That is, according to the present invention, an ideal curve to predict removal rate can be obtained to precisely control the polishing time.

Finally, while the invention has been described by way of example and in terms of the preferred embodiment, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A semiconductor process for manufacturing at least one wafer, comprising steps of:

providing a previously predicted process rate and a previously measured process rate by a process tool;

obtaining a presently predicted process rate by a first linear equation having a first variable weighting factor using the previously predicted process rate and the previously measured process rate as variables;

obtaining a process time according to the presently predicted process rate and a predetermined process target to input to the process tool; and manufacturing the wafer according to the process time by the process tool.

2. The semiconductor process as claimed in claim 1, wherein the process tool has a polishing pad.

3. The semiconductor process as claimed in claim 2, wherein the predetermined process target is a polishing thickness of a layer to be polished on the wafer.

4. The semiconductor process as claimed in claim 2, wherein the process time is the polishing time of the wafer.

5. The semiconductor process as claimed in claim 2, wherein the previously predicted process rate is a previously predicted removal rate RR*(t−1), and the previously measured process rate is a previously measured removal rate RR(t−1).

6. The semiconductor process as claimed in claim 5, wherein the first linear equation and the first variable weighting factor are:

$$RR^*(t)=W1(t)\times RR(t-1)+(1-W1(t))\times RR^*(t-1); \text{ and}$$

$$W1(t)=W1+\gamma1^t, \ 0<\gamma1<1.$$

Where W1 and γ1 are experienced constants.

7. The semiconductor process as claimed in claim 6, wherein the W1 is 0.3.

8. The semiconductor process as claimed in claim 6, wherein the γ1 is 0.2.

9. The semiconductor process as claimed in claim 5, further comprising steps of:
   providing a previous adjustment value D(t−1);
   obtaining a present adjustment value D(t) by a second linear equation using the previous adjustment value D(t−1) and the difference of the presently predicted removal rate and the previously predicted removal rate; and
   modifying the presently predicted removal rate by the present adjustment value D(t).

10. The semiconductor process as claimed in claim 9, wherein the second linear equation has a second variable weighting factor.

11. The semiconductor process as claimed in claim 10, wherein the second linear equation and the second variable weighting factor are:

$$D(t)=W2(t)\times(RR^*(t-1)-RR^*(t))+(1-W2(t))\times D(t-1);$$

and $$W2(t)=W2+\gamma2^t, \ 0<\gamma2<1.$$

Where W2 and γ2 are experienced constants.

12. The semiconductor process as claimed in claim 11, wherein the W2 is 0.3.

13. The semiconductor process as claimed in claim 11, wherein the γ2 is 0.2.

14. A semiconductor process for polishing at least one wafer, comprising steps of:
   providing a previously predicted removal rate RR* (t−1) and a previously measured removal rate RR(t−1) by a process tool having a polishing pad;
   obtaining a presently predicted removal rate RR*(t) by a first linear equation having a first variable weighting factor using the previously predicted removal rate and the previously measured removal rate as variables;
   obtaining a polishing time according to the presently predicted removal rate and a predetermined polishing thickness to input to the process tool; and
   polishing the wafer according to the polishing time by the process tool.

15. The semiconductor process as claimed in claim 14, wherein the first linear equation and the first variable weighting factor are:

$$RR^*(t)=W1(t)\times RR(t-1)+(1-W1(t))\times RR^*(t-1), \text{ and}$$

$$W1(t)=W1+\gamma1^t, \ 0<\gamma1<1.$$

Where W1 and γ1 are experienced constants.

16. The semiconductor process as claimed in claim 15, wherein the W1 is 0.3.

17. The semiconductor process as claimed in claim 15, wherein the γ1 is 0.2.

18. The semiconductor process as claimed in claim 14, further comprising steps of:
   providing a previous adjustment value D(t−1);
   obtaining a present adjustment value D(t) by a second linear equation using the previous adjustment value D(t−1) and the difference of the presently predicted removal rate and the previously predicted removal rate as variables; and
   modifying the presently predicted removal rate by the present adjustment value D(t).

19. The semiconductor process as claimed in claim 18, wherein the second linear equation has a second variable weighting factor.

20. The semiconductor process as claimed in claim 19, wherein the second linear equation and the second variable weighting factor are:

$$D(t)=W2(t)\times(RR^*(t-1)-RR^*(t))+(1-W2(t))\times D(t-1), \text{ and}$$

$$W2(t)=W2+\gamma2^t, \ 0<\gamma2<1.$$

Where W2 and γ2 are experienced constants.

* * * * *